United States Patent [19]

Heng et al.

[11] Patent Number: 5,051,871
[45] Date of Patent: Sep. 24, 1991

[54] MODULAR FUNCTIONAL BLOCK FOR MOUNTING AT LEAST ONE CIRCUIT CARD ON A SUPPORT, AND COMPONENT PARTS THEREOF

[75] Inventors: Jean-Paul Heng, Lyons; Marcel Jusseau, Villeurbanne; Jean-Marc Planel, Villeurbanne; François Boiston, Villeurbanne, all of France

[73] Assignee: Cgee Alsthom, Levallois-Perret, France

[21] Appl. No.: 625,478

[22] Filed: Jun. 28, 1984

[30] Foreign Application Priority Data

Jun. 30, 1983 [FR] France .................. 83 10893

[51] Int. Cl.⁵ .......................................... H05K 7/14
[52] U.S. Cl. .................... 361/415; 361/380; 361/399; 361/396
[58] Field of Search .......... 52/589; 220/4 F, 4 B, 220/4 D; 211/41, 189; 312/257 SK, 257 SM; 361/395, 396, 380, 399, 415, 427, 429, 396, 429; 339/198 H, 198 G, 198 R, 198 GA, 198 J, 198 C, 198 S; 346/116, 120

[56] References Cited

U.S. PATENT DOCUMENTS

| | | | |
|---|---|---|---|
| 3,265,935 | 8/1966 | Rosa | 361/415 |
| 3,271,626 | 9/1966 | Howrilka | 211/41 |
| 3,290,559 | 12/1966 | Kirby et al. | 361/394 |
| 3,316,460 | 4/1967 | Scoville | 361/415 |
| 3,360,689 | 12/1967 | Haury | 361/394 |
| 3,687,325 | 8/1972 | Simons | 220/4 F |
| 3,989,157 | 11/1976 | Veenema | 220/4 F |
| 4,013,928 | 3/1977 | Sarinopoulos et al. | 211/41 |
| 4,092,698 | 5/1978 | Brefka | 361/346 |
| 4,238,044 | 12/1980 | Roddier | 220/4 F |
| 4,486,816 | 12/1984 | Hope | 211/41 |
| 4,531,640 | 7/1985 | Shah | 211/189 |

*Primary Examiner*—Gregory D. Thompson
*Attorney, Agent, or Firm*—Sughrue, Mion, Zinn, Macpeak & Seas

[57] ABSTRACT

Electrical and electro-optical components are mounted on cards in various different sizes assembled to constitute working equipment using a set of common parts for building modular functional blocks of various sizes to house such cards. A modular functional block comprises one or more fixing bases each having a rectangular body having ends which engage respective retaining strips having grooves to form a printed circuit card-retaining frame. End plates are fitable to the various component parts mentioned above together with locking strips and closure cards to constitute a completed, enclosed functional block which can be built up to various different sizes.

23 Claims, 9 Drawing Sheets

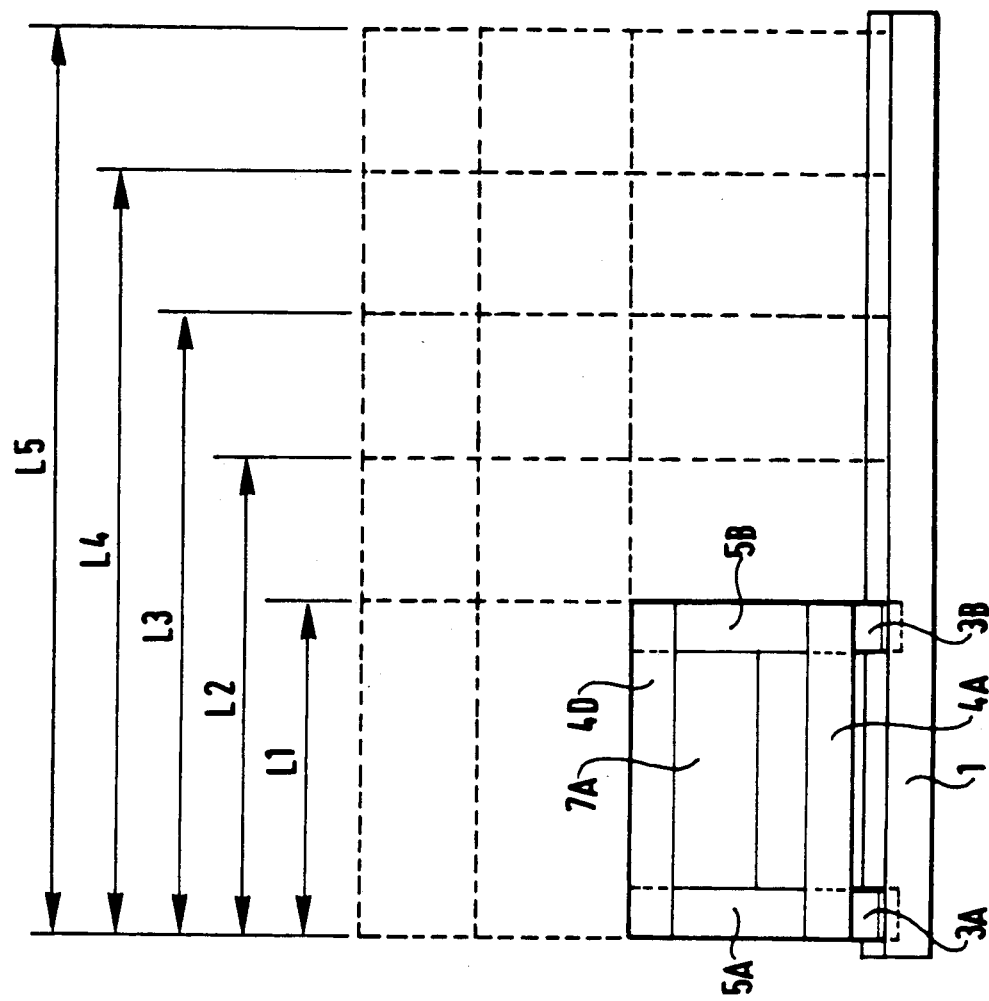
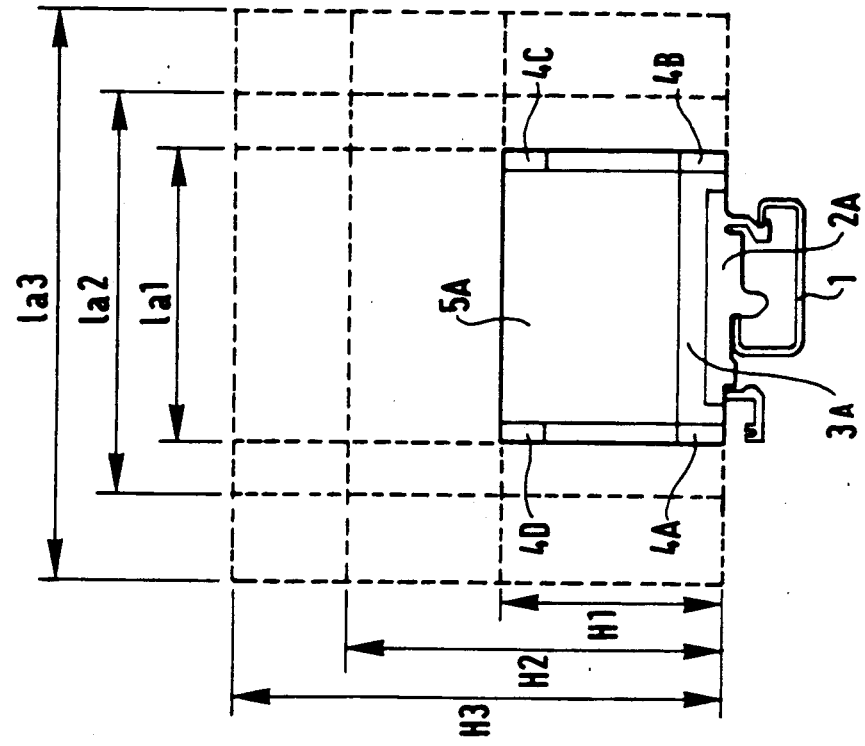

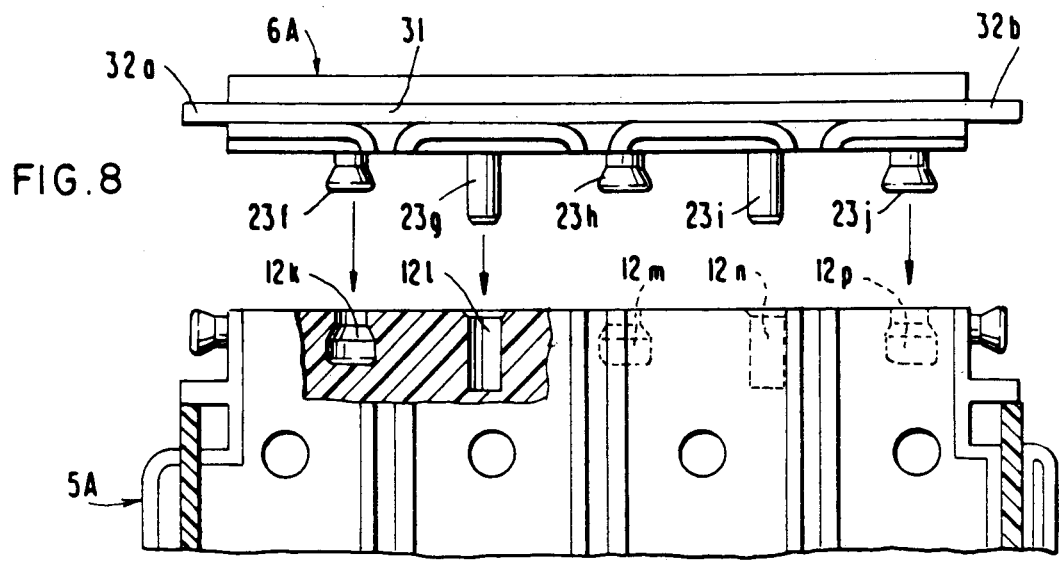
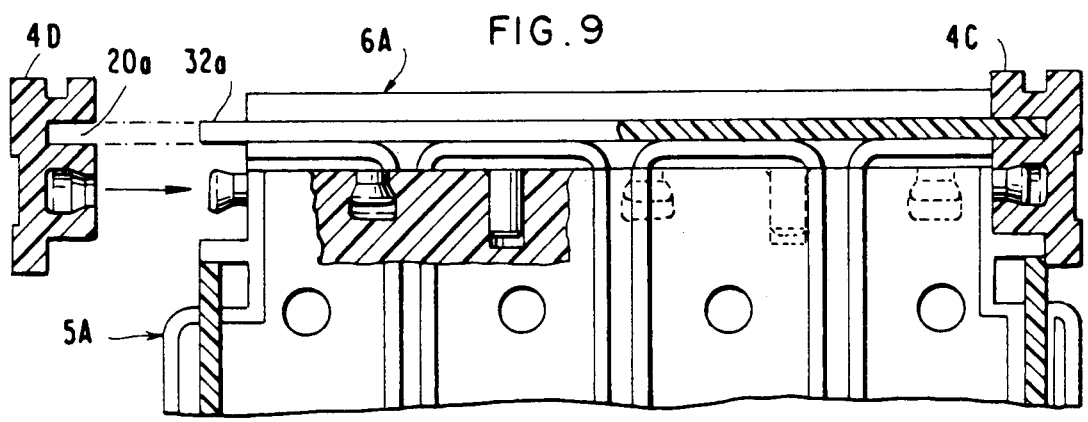
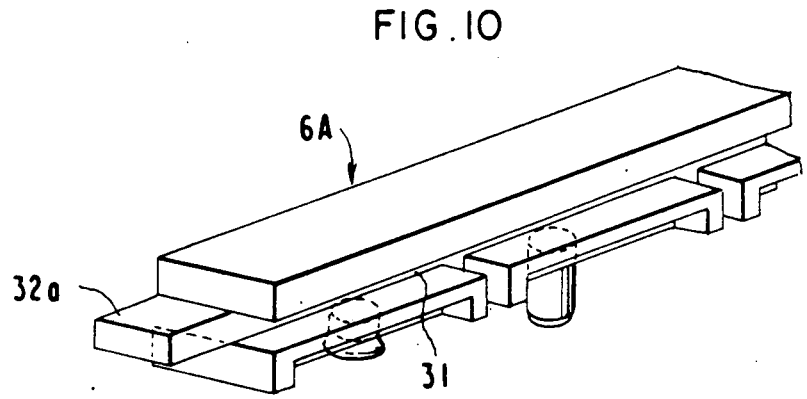

MODULAR FUNCTIONAL BLOCK FOR MOUNTING AT LEAST ONE CIRCUIT CARD ON A SUPPORT, AND COMPONENT PARTS THEREOF

The present invention relates to functional blocks for mounting circuit cards on a support, and to component parts thereof enabling such functional blocks to be built.

BACKGROUND OF THE INVENTION

Functional blocks for fastening circuit-carrying cards to a fixed, and often common, support have been known for a long time. Thus, for example, the Applicants' U.S. Pat. No. 3,833,839 describes a terminal box for fixing a printed circuit card on a section bar and for electrically connecting the card to the conductors required for its use via various terminals and tongues.

Such functional blocks are well adapted to mounting component-carrying cards of predetermined size and not exceeding some limited bulk; however, they can be adapted over only a small range of sizes which leads to a multiplicity of models of various sizes, with all the drawbacks that can entail.

Research is thus currently being performed to provide functional blocks made up from a small number of component parts which can readily be combined so as to make assemblies of different sizes depending on user requirements.

This leads to a search for component parts which are simple in shape, which are easy to use, which are cheap, and which should, if possible, be compact in order to facilitate storage.

Preferred implementations of the present invention satisfy the above requirements.

SUMMARY OF THE INVENTION

In one aspect the present invention provides a functional block for mounting at least one circuit card on a support, the functional block being constituted by standardized components which are assembled acording to requirements, the functional block comprising at least:

one or preferably two identical fixing bases each having a body which is at least approximately rectangular in shape and which is optionally mounted on a fastening part for fastening to a support, the said body having an elongate, "upper" face provided with at least one longitudinal alignment of cylindrical positioning and/or snap-fixing members, and two end faces symmetrically provided with respective positioning and snap-fixing arrangements for engaging retaining strips; and two identical retaining strips, each having at least both ends equipped with respective positioning and snap-fixing arrangements complementary to the said arrangements of the end faces of the fixing bases on an "internal" face which includes a first longitudinal retaining groove for retaining a card by one of the edges thereof.

The block may optionally further include at least two identical end plates each of which is relatively plane and rectangular in shape, with a "lower" edge thereof including an alignment of cylindrical positioning and/or snap-fixing members which are complementary to those included in an alignment made on the upper face of the fixing base and with each of its "side" edges being symmetrically provided with a positioning and snap-fixing arrangement for a retaining strip identical to the arrangements provided on the corresponding fixing base, the said arrangements being situated at the same level relative to the "upper" edge of the end plate as the arrangements of a fixing base are situated relative to the upper face of the said base.

Such a block may optionally further include at least two locking strips each of which has an elongate body which is at least approximately rectangular and which is provided with a U-shaped longitudinal groove for retaining one edge of a circuit card and which is provided with an alignment of cylindrical and/or snap-fixing members which is identical to the arrangement provided on the upper edge of an end plate or the upper face of a fixing base to which the locking strip is thus suitable to be fastened.

Each end plate may include an upper edge provided with an alignment of cylindrical positioning and/or snap-fixing members identical to the corresponding alignment of cylindrical members on the fixing base, thereby enabling end plates to be superposed one above the other on a single base to constitute a high block.

In a preferred implementation, each fixing base is provided on its upper face with two longitudinal alignments of cylindrical positioning and/or snap-fixing members which alignments are staggered and symmetrically disposed about the mid-point of the upper face, and in that each end plate is provided with a plurality of holes suitable for snap-fixing to pegs on an external one of their two faces whereby two end plates may be fastened together external face to external face by both-way snap-fixing pegs, when said two end plates are mounted on respective fixing bases in order to reinforce the functional block(s) thus obtained.

In a second aspect the present invention provides a fixing base component part for such a functional block, wherein the fixing base comprises a body which is at least approximately rectangular in shape and which is optionally mounted on a fastening part for fastening to a support, and wherein the said body has an elongate, "upper" face provided with at least one longitudinal alignment of cylindrical positioning and/or snap-fixing members, and two end faces symmetrically provided with respective positioning and snap-fixing arrangements for engaging retaining strips, the said cylindrical members and the said arrangement being arranged for co-operating with complementary members or arrangements provided on said other component parts of the block.

In a third aspect the present invention provides a retaining bar component for such a functional block, wherein the retaining bar includes two ends, and includes at least at each of its two ends, a positioning and snap-fixing arrangement, complementary to the arrangement of one of the end faces of a fixing base on an "internal" face which also includes a first longitudinal retaining groove for retaining a card by one of the edges thereof.

In a fourth aspect, the present invention provides an end plate component part for such a functional block, wherein the end plate is relatively plane and rectangular in shape, with a "lower" edge thereof including an alignment of cylindrical positioning and/or snap-fixing members which are complementary to those included in an alignment made on the upper face of a fixing base and with each of its "side" edges being symmetrically provided with a positioning and snap-fixing arrangement for a retaining strip identical to the arrangements provided on the corresponding fixing base, the said arrangements being situated at the same level relative to the "upper" edge of the end plate as the arrangements of a fixing base are situated relative to the upper face of the said base.

In a fifth aspect the present invention provides a locking bar component part for such a functional block, wherein the locking bar comprises an elongate body which is at least approximately rectangular and which is provided with a U-shaped longitudinal groove for retaining one edge of a card and which is provided with an alignment of cylindrical and/or snap-fixing members which is placed on an "internal" face of the strip and which is identical to the arrangement provided on the lower edge of an end plate.

BRIEF DESCRIPTION OF THE DRAWINGS

An embodiment of the invention is described by way of example with reference to the accompanying drawings, in which:

FIGS. 1A and 1B are end and side elevation views which show the principle of an evolving functional block in accordance with the invention;

FIG. 8 is an exploded, sectional view, partially broken away of a locking strip and end plate of the functional block of FIG. 9 is an exploded view of the locking strip and end plate of FIG. 8 further showing a pair of retaining strips attached to opposite sides thereof.

FIG. 10 is a perspective view of a portion of a locking strip of FIGS. 8 and 9.

DETAILED DESCRIPTION OF THE PREFERRED EMBODIMENT

Figure 2:
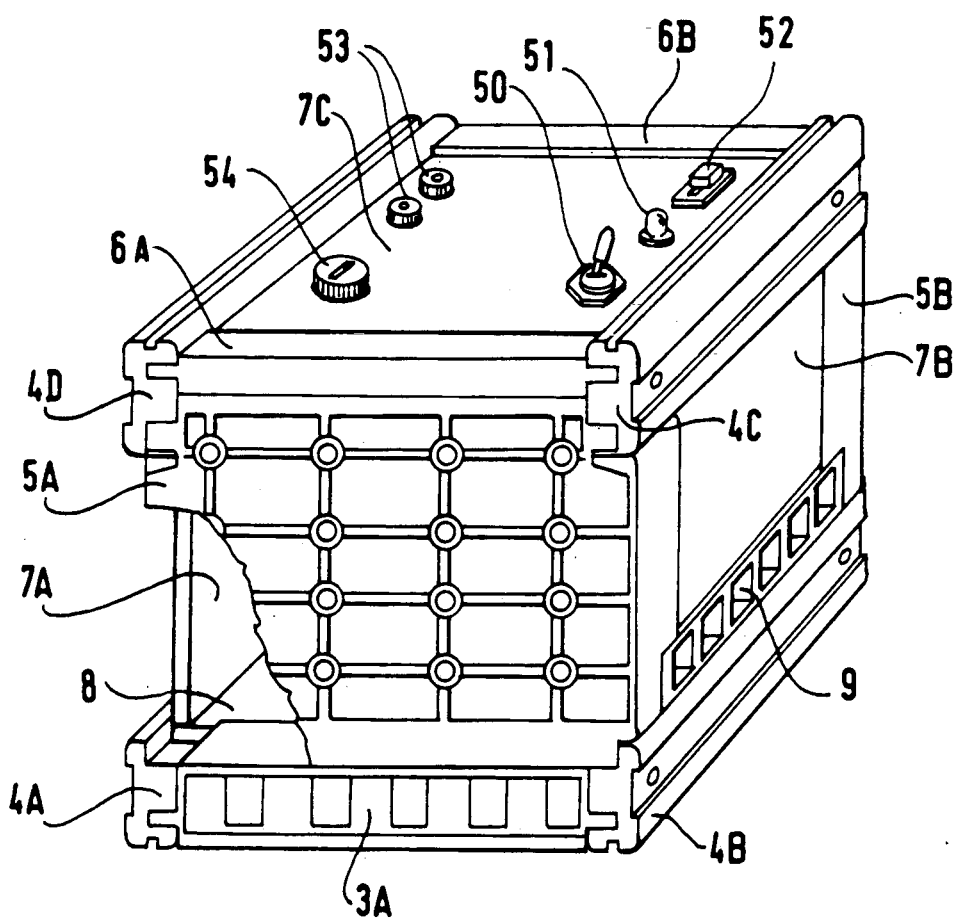
FIG. 2 is a perspective view which shows an example of a functional block in accordance with the invention.

As mentioned above, the subject matter of the invention is to provide a functional block enabling one or more cards carrying electric, electronic, opto-electronic or other circuits on a support such as a wall, a rail, or a bar, while providing the possibility of enclosing the cards to protect them.

Because of the wide range of user requirements, it is necessary to be able to provide the functional block in various shapes from a small number of component parts capable of being combined in various arrangements.

FIGS. 1A and 1B show the principle of how a block in accordance with the invention can change. In the example given here the block is intended to be mounted on a support constituted by a standardized rail 1 and by means of a fastening part, e.g. the part 2A. The fastening part 2A includes three hooks in this case, and is of conventional type for fitting to various different types of standardized rail. In conventional manner, it may either be an integral part of a fixing base 3A for the box, or else it may be snap fitted thereto.

The shape of the functional block (which is conventionally in the form of a box having positioning grooves for circuit cards) may be varied by modifying the component parts of the block.

In accordance with the invention, the necessary component parts comprise retaining strips such as strip 4A, end plates, e.g. plates 5A and 5B, locking strips, e.g. 6A and 6B, and closure cards or other such as 7A and 7B. These components are in addition to the fixing bases, e.g. 3A and 3B.

A first possible variation in the shape of a block is shown in FIG. 1A, and it is based on a superposition heightwise of identical components, in particular end plates 5A, using a method which is described below, in order to obtain functional blocks of various heights symbolized by H1, H2 and H3 in FIG. 1A.

Another possible variation is shown in FIG. 1B and consists in providing some of the simple component parts in various lengths, which can readily be obtained in these different lengths by virtue of their shapes, e.g. the retaining strips 4A, 4B, 4C, 4D, etc. and the protective closure cards 7A. This makes it easy to obtain functional blocks of various lengths as symbolized by arrows L1 to L5 in FIG. 1B.

Naturally it is possible to combine both possibilities of variation mentioned above.

Yet another possibility of variation shown in FIG. 1A consists in making the more complex component parts larger, which may require them to be reinforced. For example, the end plates may be made larger either along a single dimension as symbolized by indications la1, la2, and la3 to keep them compatible with at least some of the other component parts, or else they can be changed in both dimensions. A complementary possibility which is not shown consists in superposing components of the same type and of different dimensions, e.g. the end plates.

Finally, as is explained below, it is also possible to make use of a portion only of the component parts to form a simplified functional block or to combine only some of the component parts in various ways, e.g. the end plates 5A, ect. or the protecting strips 4A, ect., not to mention the closure cards 7A ect.

A specific example of a functional block is shown in FIG. 2. As already mentioned it comprises at least two fixing bases, of which only one 3A is visible. This fixing base 3A is shown without a fastening part, as is appropriate for such a functional block being fixed to a plain wall.

The functional block also includes two end plates 5A and 5B, with the plate 5A being shown partially cut away to show how one circuit card 8 out of several possible cards is disposed. Each end plate 5A, 5B is fixed to a fixing base, e.g. 5A to 3A, FIGS. 11, 12, which also supports two retaining strips 4A and 4B which are engaged at respective ends of the base. A circuit card 8, e.g. having a printed circuit serving electronic components or electromagnetic relays placed on one of its faces, presses against the sides of a longitudinal L-shaped groove made in the edges of the strips 4A and 4B.

The two end plates 5A and 5B are both fixed to the upper face of a respective one of the fixing bases such as 3A and they are arranged in such a manner as to enable closure cards, e.g. 7A and 7B to be placed and held in association with two retaining strips 4C, 4D which are engaged at the tops of the side edges of each end plate FIG. 8, 9 and 10. The cards are held by being in grooves the end plates and in the retaining strips.

Thus, in the example shown, the closure card 7A presses against the edge of the circuit card 8, and against at least one of the sides of the longitudinal L-shaped grooves which are provided in the retaining strips 4A and 4D, and in grooves which are not visible in this figure which are provided in the lower portions of the side edges of the end plates 5A and 5B on the same side as the closure card 7A.

In contrast, the closure card 7B is applied in this case to a terminal connector strip 9 which is fixed to the side of the circuit card 8. It should be understood that the said closure card 7B is otherwise held in a similar manner to the closure card 7A by grooves in strip 9 which correspond to at least some of the grooves mentioned above.

The functional block thus constituted is also provided with a closure card 7C acting as a lid which is positioned via its edges in longitudinal grooves in the retaining strips 4C and 4D and under longitudinal strips of reduced thickness of the locking strips 6A and 6B which snap onto the end plates 5A and 5B and in this case onto the retaining strips 4C and 4D.

It should be observed that a simplified functional block for mounting one circuit card may be obtained from two fixing bases, two retaining strips, and two locking strips snap fixed to each of the fixing bases, or else by the circuit card being screwed to the fixing bases which need to be capable of receiving self-tapping screws in at least some of the holes therein, e.g. holes 12a–12j; FIG. 3B.

It would also be possible to use a single fixing base on which the circuit card is placed flat.

Figure 3A:
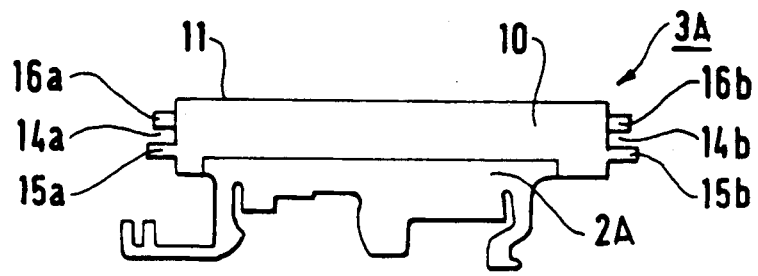
FIGS. 3A and 3B are front and top plan views, respectively, of a fixing base.
Figure 3B:
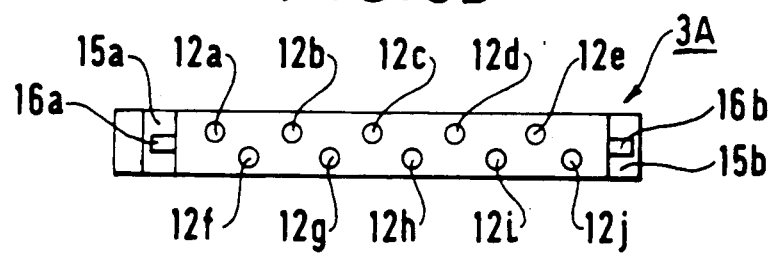

FIGS. 3a and 3b show one embodiment of a fixing base for a functional block in accordance with the invention.

Figure 6:
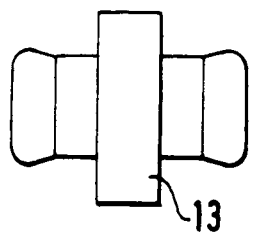
FIG. 6 is a plan view which shows a snap-fixing peg.

The fixing base 3A is shown in a front view in FIG. 3a and comprises a body 10 of roughly rectangular shape, made, for example, of polyamide and to which a conventional fastening part 2A having three hooks have been fixed to enable it to be mounted on a conventional standardized rail. The "upper" face alone situated on the other side of the body relative to the fastening part 2A includes at least one longitudinal alignment of cylindrical positioning and/or snap-fixing means. These means are holes in the present case comprising, for example, FIG. 11, two cylindrical positioning holes 12b, 12d and three snap-fixing holes 12a, 12c and 12e intended for receiving respective cylindrical guide rods and cylindrical resilient snap-fixing pegs. The snap-fixing holes, e.g. 12a, may, for example, be constituted by a short cone FIGS. 11, 12, limited firstly by the upper face to which the axis of symmetry of the cone is perpendicular, and from which it flares away, and secondly by a small cylinder about the same axis in such a manner as to enable the swollen end of a peg 13 such as shown in FIG. 6 to be retained supposing that the peg has two swollen ends.

In the embodiment shown in FIG. 3B, the "upper" face includes two longitudinal alignments of cylindrical holes 12a to 12e and 12f to 12j which are identically distributed and which are symmetrically staggered about the center or optionally about a central point of the upper face 11.

The fixing baswe 3A also includes positioning means and snap-fixing means for strips which are disposed symmetrically on the end faces 14a and 14b adjacent to the upper face.

Said means comprise tongues 15a, 15b disposed parallel to the upper face 11 and projecting from end faces 14a, 14brespectively face 14a, 14b, together with single cylindrical snap-fixing peg 16a, 16b 16a, 16b, at each end face disposed along the longitudinal axis of the body 10 between the tongues 15a, 15b and the upper face 11, and preferably equally spaced therebetween.

Figure 4:
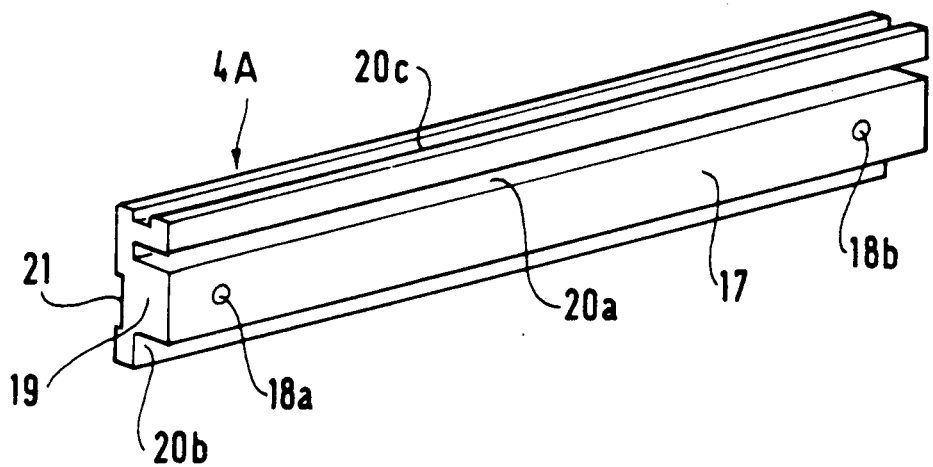
FIG. 4 is a perspective view which shows an example of a retaining strip.

A retaining strip 4A shown in FIG. 4 comprises an elongated rectangular body, e.g. made of polyamide, which is provided with a positioning and snap-fixing means at least at each of the ends of one of its major faces 17, referred to as its "internal" face. The said means being complementary to the positioning and snap-fixing means of the fixing base in such a manner as to enable the strip to be fixed to at least two fixing bases.

In the example shown in FIG. 4, these complementary means are constituted firstly by cylindrical snap-fixing holes 18a and 18b which may optionally go right through the strip and which are made in the internal face 17 at least at both ends thereof. Preferably, the distance between the axis of each of these cylindrical holes and the closed end face 19 of the strip is equal to the distance between the axis of a snap-fixing pegs 16a, 16b on each of the fixing bases and both of the side faces thereof adjacent to its upper face 11, whereby the retaining strips such as 4A when in position on the fixing base 3A has its ends flush with the large side faces of the fixing base.

Further, each complementary snap-fixing and positioning means existing on a retaining strip also includes at least one longitudinal groove 20a which is suitable for engaging a tongue 15a associated with a peg 16a to which the strip is engaged, thereby preventing relative movements between the component part having the said peg and the said tongue and the retaining strip.

For this purpose, in one embodiment, each retaining strip such as that at 4A includes a first U-shaped longitudinal groove 20a along its internal face, with the groove being of such a width and such a depth as to match the thickness and the length of a tongues 15a, 15b on fixing base such as 3A, and with the groove 20a being at such a distance from the cylindrical snap-fixing holes 18a, 18b, as to match the distance between the tongues 15a, 15b and the pegs 16a, 16b adjacent thereto on fixing bases 3A. Thus, it is possible to obtain a first engagement of the retaining strips on the fixing bases in which the tongues 15a, 15b are slid into the U-shaped longitudinal grooves 20a of the various strips. In such an assembly, it is then possible to lodge the opposite sides of a closure or isolation card such as card 7A or of a circuit card 8 between the two U-shaped longitudinal grooves in the internal faces 17 of two retaining strips 4A, 4B fixed parallel to one another at opposite ends of two fixing bases, thereby holding the card 7A or 8.

Retaining strip 4A also includes a second plate-retaining longitudinal groove 20b which is L-shaped, and which extends firstly by one of its sides through one of the edges adjacent to the internal face 17 of the strip, and secondly by its other side through the other side through the said internal face 17.

Preferably, this longitudinal L-shaped groove 20b is situated on the opposite side of the cylindrical snap-fixing holes 18a, 18b of the internal face 17 to the U-shaped longitudinal groove 20a. Further, the cylindrical holes 18a, 18b are preferably equally spaced on the closest sides of the U-shaped and L-shaped longitudinal grooves 20a and 20b on either side thereof in the internal space. This makes it possible to obtain a second assembly of the retaining strip such as 4a on the fixing base 3A in which the tongues 15a, 15b engages one of the walls of the L-shaped groove 20b. It is also possible, in such a case, to lodge a circuit card 8 or optionally a protective card in the grooves 20a of two facing retaining strips 4A, 4B which are identically mounted on two fixing bases.

Retaining strip 4A also comprises a third longitudinal groove 20c which is U-shaped and which is formed in that one of the side of the strip which is adjacent to the internal face 17, which is perpendicular thereto, and which does not include the L-shaped longitudinal groove 20b. The groove 20c serves essentially to lock the protective card 7A when it is in the limit outside the block.

Finally, a retaining strip such as strip 4A includes a longitudinal hollow 21 on its external face for receiving a label.

Figure 11:
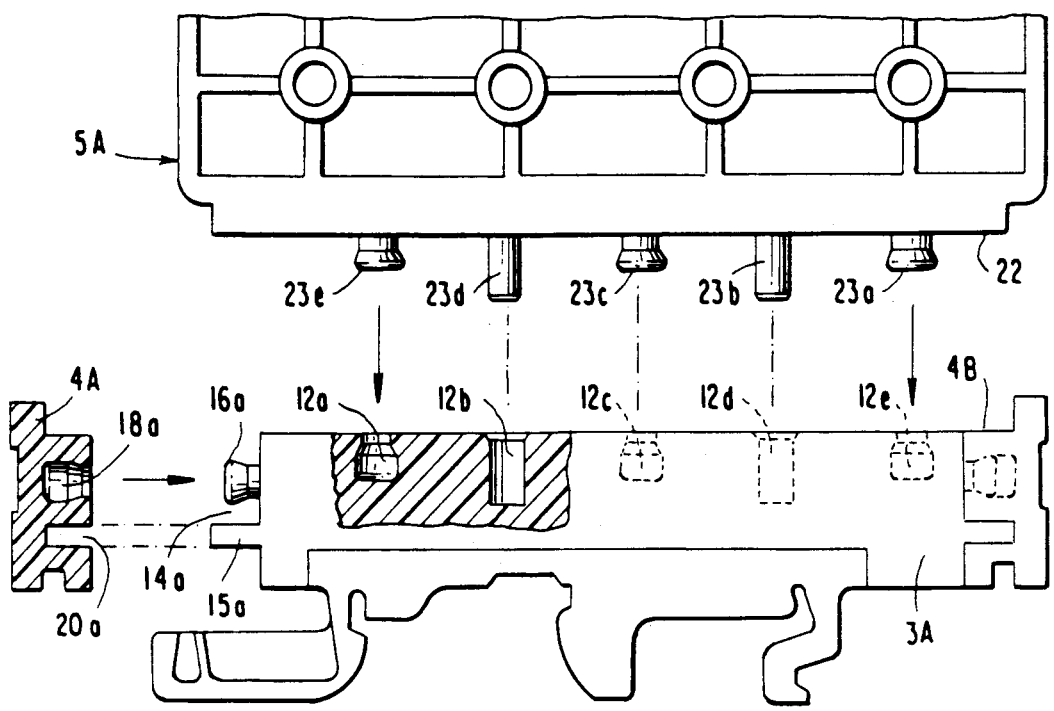
FIG. 11 is an exploded view, partially broken away, of a portion of an end plate, a fixing base and a pair of retaining strips of the functional block of FIG. 2.
Figure 12:
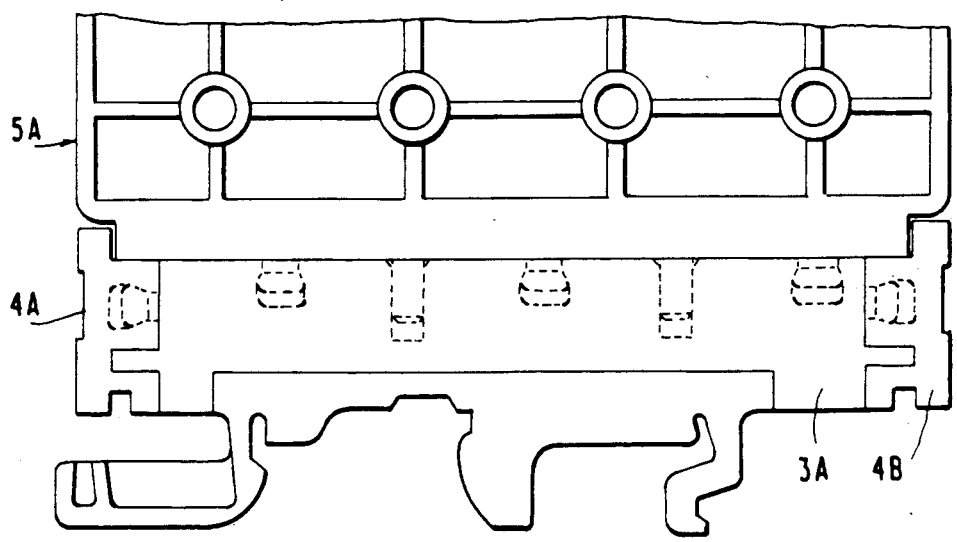
FIG. 12 is an enlarged view of the block components of FIG. 11 as assembled.

The end plates of a given range are preferably identical as are the fixing bases for the same range of component parts. Each end plate such as the plate 5A shown in FIGS. 5A-5D is generally plain and rectangular in shape and includes on one edge 22, referred to as "lower" edge, an alignment of cylindrical positioning and/or snap-fixing members which are complementary to the holes constituting the alignment of the upper face 11 of the corresponding fixing face. Such an alignment thus comprises, in the present example and as seen in FIGS. 11, 12, two round positioning rods 23b and 23d which are inserted between three single snap-fixing pegs 23a, 23c and 23e in such a manner as to co-operate, for example, with the alignment of holes 12a to 12e or 12f to 12j for assembling an end plate such as 5A on a fixing base such as 3A.

Figure 13:
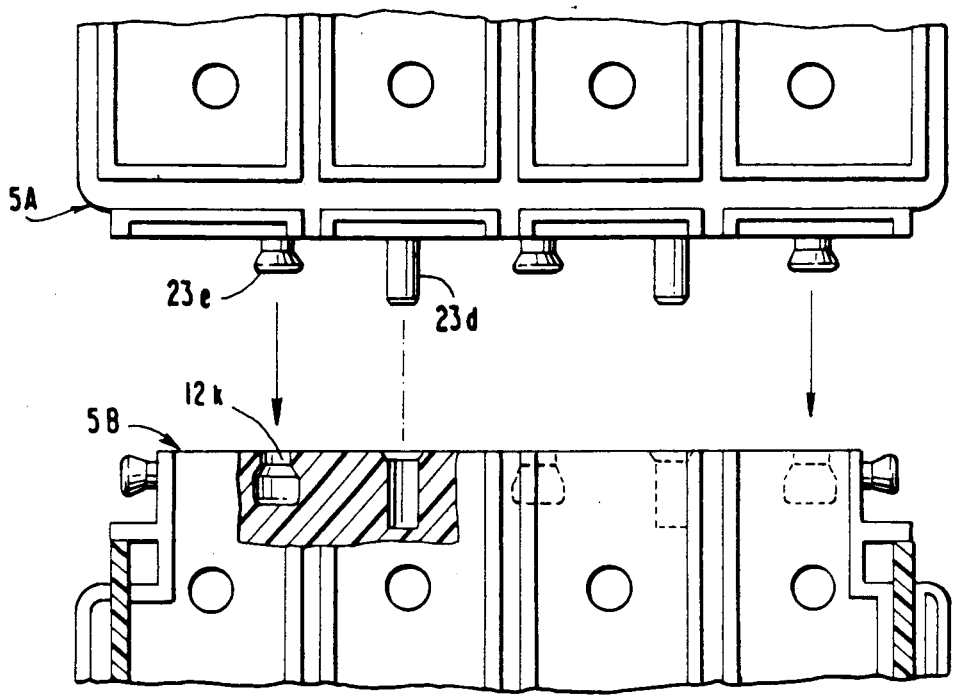
FIG. 13 is an exploded view of a pair of edge connected end plates of upper and lower functional blocks prior to assembly.
Figure 14:
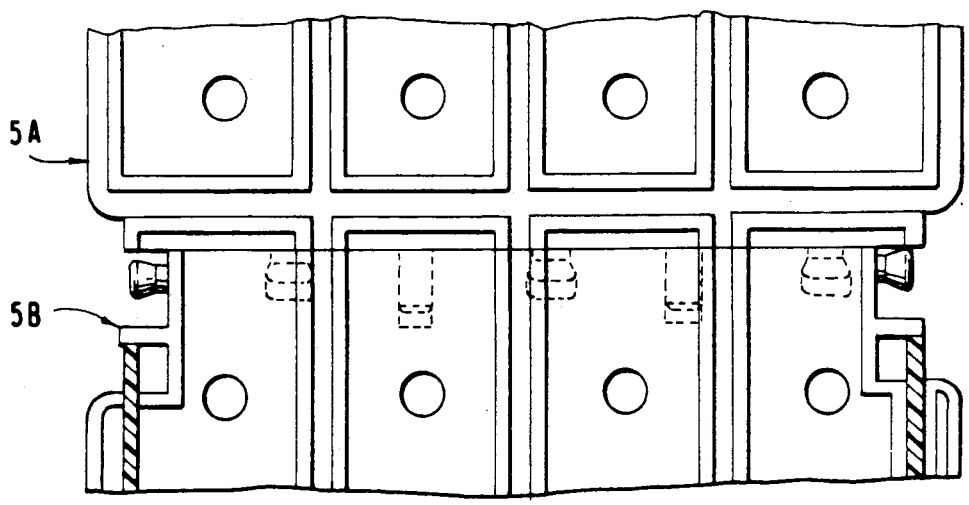
FIG. 14 is a further view of the end plates of FIG. 13, after snap coupling assembly.

Likewise, the opposite or "upper" edge 24 of an end plate 5A includes an alignment of cylindrical positioning and/or snap-fixing means, e.g. 12k, 12p, ect. which are identical to the members of a fixing base, i.e. which comprise holes in such a manner as to enable one end plate to be superposed on another by inserting the rods and pegs on the lower edge of one of the plates into the holes in the upper edge of the other FIGS. 13, 14.

Preferably, the cylindrical members of a lower edge 22 and of an upper edge alignment are offset longitudinally by an identical amount corresponding to the amount provided in the opposite direction for the cylindrical members of each alignment of a fixing base, whereby an end plate and, optionally further end plates mounted thereon, may be mounted on a fixing base either way around relative to the interior of the assembled functional block.

The lower edge 22 of the end plate 5A is as long as the sum of the length of the upper face 11 of a corresponding fixing base plus twice the length of the side of the L-shaped groove 20b provided in the corresponding retaining strip 4 to be level with the said upper face of the fixing base.

Further, the side edges 25a, 25b and the lower edge 22 on either side thereof are notched where they meet in such a manner as to enable two retaining strips and the end plate assembled therewith on the same fixing base to interpenetrate, thus increasing the rigidity of the block in which they are assembled.

An assembled functional block is thus obtained in which the external faces of the strips and the side edges of the end plates are practically level.

Figure 5A:
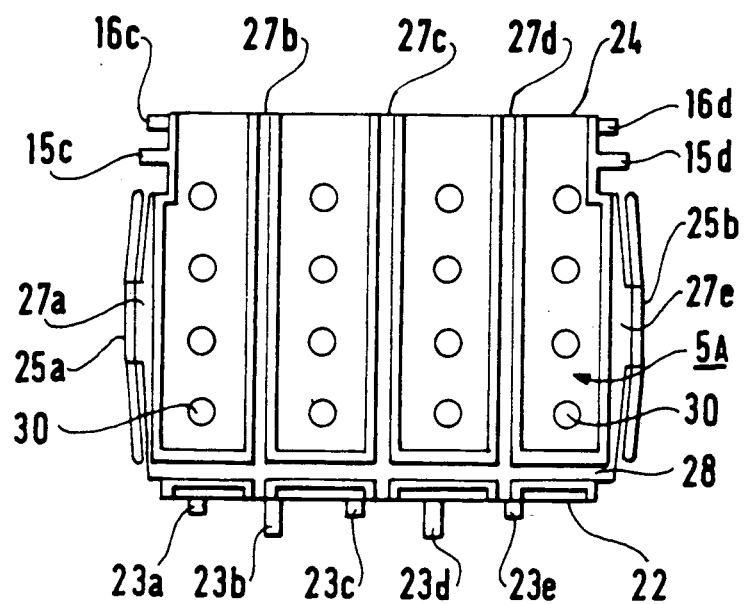
FIGS. 5A to 5D are front elevational, bottom plan, rear elevational and top plan views, respectively, of an end plate.
Figure 5B:
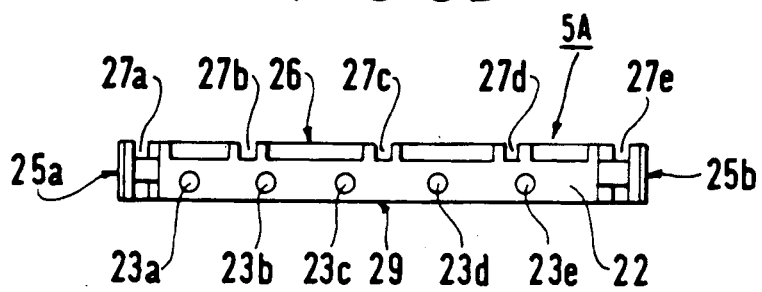
Figure 5C:
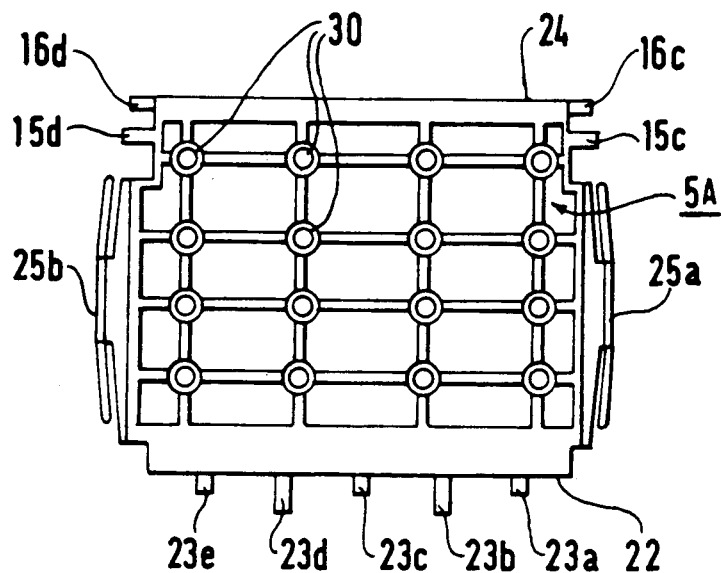
Figure 5D:
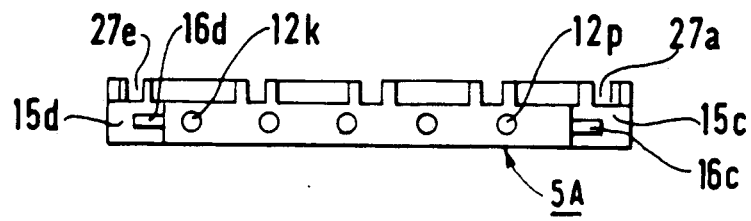

The side edges 25a and 25b for end plate 5A, FIG. 5C, are each provided with a positioning and snap-fixing means identical to the means on the corresponding bases, these means being symmetrically situated close to the upper edge 24 of the end plates. As already explained they are constituted by a snap-fixing peg 16c, 16d and by a tongue 15a, 15d parallel to the upper edge 24 of the end plate. Naturally, the positioning and the sizes of the pegs and tongues are identical to those of the corresponding fixing bases to enable identical retaining strips to be mounted on the fixing bases and on the end plates of the same functional block.

The distances on the upper edge 24 between positioning and snap-fixing means of an end plate and on the upper face 11 between the identical arrangements of the corresponding fixing face are thus preferably equal to enable regular stacking of the base and the end plate(s) which it carries.

One of the large faces 26, FIGS. 5A, 5B, referred to as the "internal" face, of an end plate comprises a plurality of transverse grooves, in this case referenced 27a to 27e, for holding the cards. The grooves are U-shaped and extend from the lower edge 22 to the upper edge 24 of the end plate.

A longitudinal U-shaped groove 28 is also provided in the internal face 26 of an end plate slightly above the lower edge 22 thereof in such a manner as to enable a card to be retained by one of its edges being held between the sides of the longitudinal groove 28.

It is thus possible to place the cards in functional blocks in at least two perpendicular directions, and a card may be placed on a third direction parallel to the end plates by using additional parts in place of the retaining strips ( not shown).

In a preferred embodiment, each transverse groove such as 27a, etc. and the longitudinal groove 28, FIG. 5A are made in thickened portions of the end plate material, e.g. polyamide, thereby saving said materials.

Further, the outermost transverse grooves 27a and 27e which are more particularly intended to retain closure cards such as 7A, 7B, are limited in length towards the upper edge 24 so as to enable the retaining strips 4C, 4D to be engaged on either side of the end plate in co-operation with the positioning and snap-fixing arrangements which are provided on the side edges at this level and upper ends oriented respectively towards the lower edge 22 and upper edge 24. They are made, for example, in the form flexible tongues sloping towards the inside of the grooves 27e to which they are adjacent.

The outermost transverse grooves 27a and 27e are also preferably reduced in length at the lower edge to enable connection components such as connectors or terminal strips to be provided at this level over the entire length available between end plates with a minimum loss of space.

The other large face 29, referred to as the "external" face, of the end plates includes undifferentiated holes 30 for snap-fixing pegs. These holes are visible in FIGS. 5A and 5C. They are regularly distributed over the outer face and they open to the inner face.

Figure 7A:
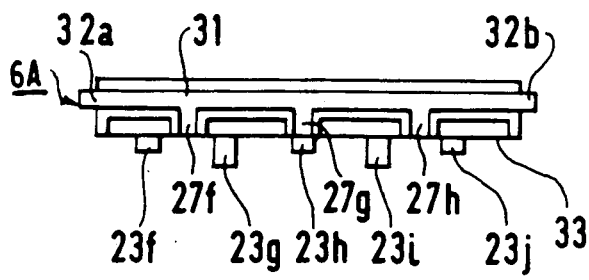
FIGS. 7A and 7B are front elevational and end views, respectively, of a locking strip.
Figure 7B:
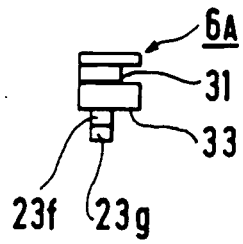
Figure 16:
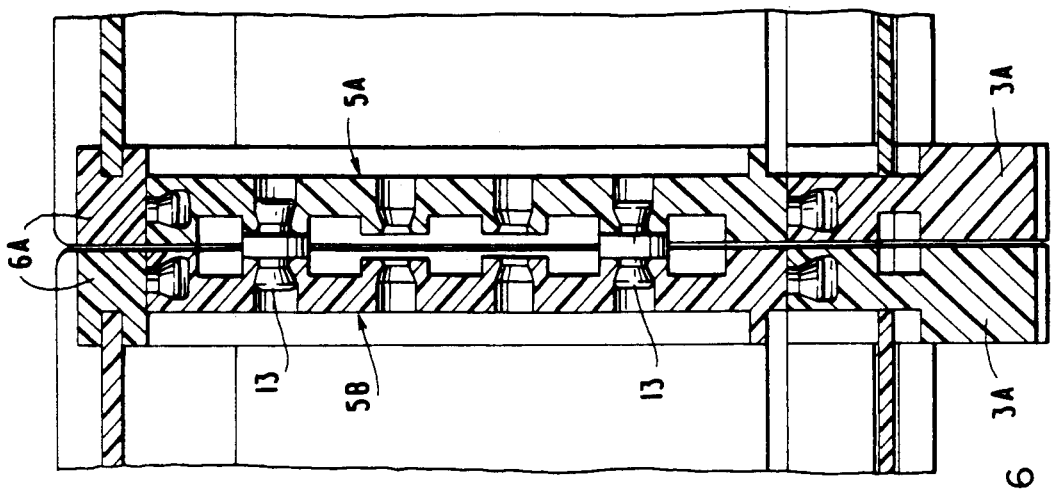
FIG. 16 is a vertical sectional view of a pair of side by side functional blocks of FIG. 15, after snap coupling assembly.
Figure 15:
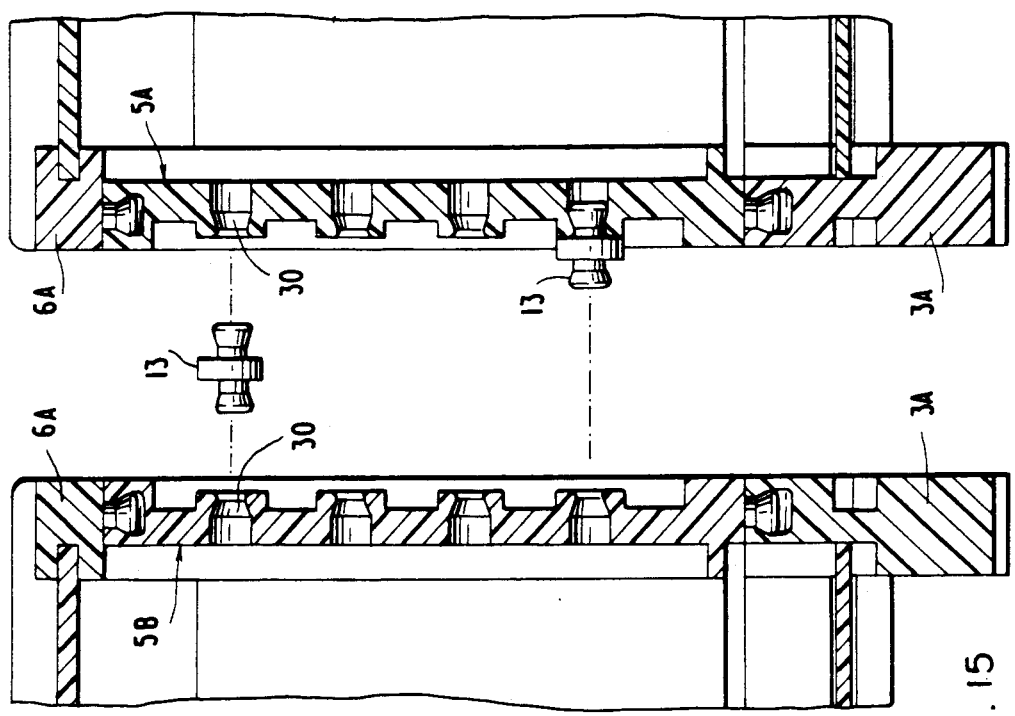
FIG. 15 is a vertical sectional view of portions of a pair or side by side functional blocks prior to assembly via a number of snap-fixing pegs.

Firstly, they serve to ventilate functional blocks where this may be required, and secondly they enable two end plates mounted on respective bases to be snap-fixed together outer face to outer face. This is performed symmetrically by means of double headed or both way snap-fixing peg 13, as seen in FIGS. 15, 16, such as shown in FIG. 6. This enables the structure to be reinforced when the blocks are of large size, and it also enables special arrangements to be built (not shown). The locking strip 6B shown in FIGS. 7A and 7B is intended to complete the blocks, and it comprises a generally rectangular body having a "lower" large face 33 analogous to the lower edge 22 of an end plate and having the same cylindrical positioning and/or snap-fixing members, e.g. 23f 23j, complementary to the members on the upper edge 24 or to an alignment on a base, and also in the same position.

It is thus possible to snap-fix a locking strip either directly to a fixing base or to an end plate.

A U-shaped groove 31 is provided longitudinally in one of the sides (referred to at the internal side) of the body of the locking strip, and this groove serves to receive and retain a closure card such as 7A or circuit card 8.

This makes it possible to lock a circuit card 8 on a simplified functional block comprising two fixing bases, two retaining strips and two locking strips.

The body of the locking strip 6B is as long as a fixing base as measured between opposite tongues 15a and 15b. The body is thinner at its ends in order to have the same thickness as a tongue over a distance equal to the distance by which the tongues project and at the same level as the groove 31 so as to penetrate into the longitudinal U-shaped grooves 20a of the retaining strips.

This serves to reinforce the structure of a functional block near its part where the retaining strips and the fixing bases engage or where the retaining strips and the end engage in one another in the two retaining strip assemblies mentioned above.

In the first of these assemblies, the reduced thickness ends of the locking strip such as 6B are simply applied on the longitudinal L-shaped grooves 20b of the two retaining strips positioned on the fixing bases or on the parallel end plates.

In the second case, the reduced thickness ends engage in the longitudinal U-shaped grooves of the retaining strips and reinforce the strength of the functional block made thereby.

The longitudinal groove 31 and the transverse grooves, 27f, 27g and 27h which are in the same positions as the grooves 27b to 27d of the end plates are also provided in extra thicknesses of strip constituting material for the same purposes as mentioned above.

The closure cards such as at 7A are not shown here in that they are of conventional plain rectangular shape and may have various different aspects, e.g. transparent, colored, label-bearing, diagram-bearing, or provided with special openings as required. the same is true of the circuit cards.

A possibility is also provided for mounting auxiliary equipment as shown in FIG. 2 in which the closure card 7C is shown having auxiliary equipment such as switches 50 and 52, an indicator lamp 51, test points 53 and a fuse holder 54.

Numerous variants may thus be obtained ranging from the simplified functional block mentioned above in which the circuit card is unenclosed to a functional block in which the or several circuit cards are completely enclosed by closure plates inserted in the various appropriate grooves in the block.

Naturally, the respective positions and/or the number of positioning components and/or snap-fixing components may be inverted, likewise the positioning and snap-fixing arrangements on the component parts that have them may be inverted.

Similarly, the shape and disposition on the cylindrical members, the pegs and the tongues may be varied while remaining within the scope of the invention.

Finally, as already briefly outlined, it is possible to superpose end plates of decreasing size in such a manner as to obtain at least two superposed blocks of desreasing volume. This requires the cylindrical positioning and/or snap-fixing members of the smaller size end plates to correspond with those of the larger end plates on which they are mounted.

We claim:

1. A modular functional block mounting at least one circuit card (8), said functional block comprising: two identical fixing bases (34), each said base being approximately rectangular in shape and having an enlongated upper face (11), aligned first positioning snap-fixing means (12a-12e) on said upper face, each said base further having two end faces (14a, 14b) symmetrically provided with respective second positioning snap-fixing means constituted by tongues (15a, 15b) and parallel cylindrical elements (16a, 16b) for retaining strips (4A, 4B); and two identical retaining strips (4A, 4B), each retaining strip having an internal face and third positioning snap-fixing means constituted by cylindrical elements (18a, 18b) and retaining grooves (20a, 20b) on said internal face, said third positioning snap-fixing means being complementary to said second positioning snap-fixing means and snap-engaged therewith, one of said retaining grooves engaging said second positioning snap-fixing means and the other retaining groove retaining one of two opposite edges of said circuit card (8) mounted in said functional block between the said two retaining strips (4A, 4B).

2. A modular functional block according to claim 1, further including ast least two identical end plates (5A, 5B) and two further retaining strips (4A, 4B), each said end plate being approximately rectangular in shape, and having a lower edge (22) thereof including fourth postioning snap-fixing means (23a-23e) which are complementary to said first positioning snap-fixing means of said fixing bases and being snap-fixed thereof, each said end plate further comprising two opposite edges (25) symmetrically provided with fifth positioning snap-fixing means (15c, 16c, 15d, 16d) which are complementary to said third positioning snap-fixing means of said retaining strips and being snap-fixed to said further retaining strips, and each said end plate further comprising an upper edge provided with sixth positioning snap-fixing means (12k-12p), similar to said first positioning snap-fixing means of said fixing base.

3. A modular functional block according to claim 2, further including at least tow locking strips (6A, 6B), each said locking strip being elongated and of approximately retangular form, and being provided with a longitudinal U-shaped retaining groove (31) retaining a card (7,8), and each said locking strip being also provided with seventh positioning snap-fixing means (23f-23j) indentical to said fourth positioning snap-fixing means.

4. A modular functional block according to claim 3 comprising further end paltes (5) having upper and lower edges respectively provided with complementary fourth and sixth positioning snap-fixing means, said further end plates being superposed on the end plates and snap-fixed on the fixing bases of said functional block by said complementary fourth and sixth positioning snap-fixing means, thereby forming a relatively high modular block.

5. A modular functional block according to claim 2, wherein said fixing bases (3A) are each provided on an upper face thereof with two staggered and symmetrically disposed longitudinal alignments of first positioning snap-fixing means (12a-12e, 12f-12j) to support end plates (5A, 5B), face-to-face, wherein said block further includes a plurality of both way snap-fixing pegs (13), wherein said ends plates, each having an internal face (26) and an external face (29), are provided on said external face (29) with a plurality of snap-fixing holes (30) receiving said snap-fixing pegs (13), whereby face-to-face positioned end plates of adjacent functional blocks are fastened together by said both way snap-fixing pegs fitted into said snap-fixing holes, in order to reinforce the functional blocks.

6. A modular functional block according to claim 3, wherein:
   each of said end plates (5A, 5B) comprises an internal face (26) provided with (longitudinal and transverse) grooves (27a, 27e, 28);
   each of said retaining strips (4A, 4B) is provided with longitudinal grooves (20a-20c) including said first retaining grooves; and
   closure cards (7A, 7B, 7C) have edges respectively engaged in grooves of said end plates, of said retaining strips and of said locking strips in closing off the functional block with said circuit card (8).

7. A modular functional block according to claim 6, further including at least one equipment auxiliary component (50) mounted on a closure card (7) so as to be accessible from the exterior of said block.

8. A fixing base for combining at least a like fixing base (3A) and two identical retaining strips (4A) constituting a modular functional block for mounting at least one circuit card (8), said fixing base comprising:
   a body, substantially rectangular in shape, having an elongated upper face (11) with first aligned positioning snap-fixing means (12a-12e) thereon, said base further having two end faces (14a, 14b) symmetrically provided with respective second positioning snap-fixing means (15a, 16a, 15b, 16b), said second positioning snap-fixing means being adaptable for engaging the retaining strips and wherein the upper face (11) of said fixing base includes two staggered and symmetrically disposed longitudinal alignments of first positioning snap-fixing means (12a-12e, 12f-12j).

9. A fixing base for combining at least a like fixing base (3A) and two identical retaining strips (4A) constituting a modular functional block for mounting at least one circuit card (8), said fixing base comprising:
   a body, substantially rectangular in shape, having an elongated upper face (11) with first aligned positioning snap-fixing means (12a-12e) thereon, said base further having two end faces (14a, 14b) symmetrically provided with respective second positioning snap-fixing means (15a, 16a, 15b, 16b), said second positioning snap-fixing means being adaptable for engaging the retaining strips and wherein the second positioning snap-fixing means of each end face comprise respectively a positioning tongue (15c, 15b) and a cylindrical positioning snap-fixing peg (16a, 16b) both disposed parallel to the upper face (11) of the body and projecting outwardly from a respective end face, and a respective peg being situated above a respective positioning tongue.

10. A retaining strip for combination with at least a like retaining strip and two identical fixing bases (3) to constitute a modular functional block for mounting at least one circuit card (8), each said fixing base being approximately rectangular in shape and having an elongated upper face with aligned first positioning snap-fixing means (12a-12e) thereon, each said fixing base further having two end faces (14a, 14b) symmetrically provided with respective second positioning snap-fixing means (15a, 16a, 15b, 16b) engagable with said retaining strips (4A, 4B) thereon at an end thereof to constitute said modular functional block, said retaining strip further comprising an internal face and third snap-fixing means (18a, 18b, 20a, 20b) on said internal face, said third positioning snap-fixing means being complementary to said second positioning snap-fixing means and snap-engagable therewith, each said internal face including at least one longitudinal retaining groove (20a or 20b) for retaining one of two opposite edges of a circuit card (8) mountable in the said functional block between the said two retaining strips (4).

11. A retaining strip according to claim 10, further having on said internal face two, longitudinal, retaining grooves (20a, 20b), one of said retaining grooves being engagable with said third positioning snap-fixing means, with the other adapted to retain one of the two opposite edges of a circuit card (8) mounted in the said modular functional block between the said two retaining strips (4A, 4B), a first of the two retaining grooves (20a) being U-shaped, extending over the entire length of the internal face and having a width and a depth which correspond respectively to the thickness and the projection extent of a tongue (15a) of said second positioning snap-fixing means, on said fixing bases, with which it is interengagable.

12. A retaining strip according to claim 11, wherein a second of the said two, longitudinal, retaining grooves (20b) is L-shaped within a first of the two longitudinal edges of said internal face.

13. A retaining strip according to claim 11, further comprising a U-shaped receiving longitudinal groove(20c) within a second of the two longitudinal edges of said internal face.

14. A retaining strip according to claim 13, wherein said third positioning snap-fixing means (18a, 18b, 20a, 20b) include peg-receiving snap-fixing holes (18a, 18b) on each end of said internal face, in juxtaposition with said longitudinal retaining grooves (20a, 20b).

15. A retaining strip according to claim 14, wherein said snap-fixing holes (18a, 18b) are equidistant from the said longitudinal retaining grooves (20a, 20b) thereby enabling two different top to bottom mountings of the said retaining strip on a fixing base, with one of the said snap-fixing holes (18a) engaging a peg (16a) protruding from a first end-face of the said second positioning snap-fixing means and either one (20a) or the other (20b) of the said two retaining grooves of the same retaining strip engaging the tongue (15a) protruding from the same first end face than the above considered peg (16a).

16. An end plate (5A) for combination with at least one like end plate, two identical fixing bases (3A, 3B) and at least two identical retaining strips (4D) to constitute a modular functional block for mounting at least one circuit card (8), each said fixing base being approximately rectangular in shape and having an elongated upper face (11) with aligned first positioning snap-fixing means (12a-12e) on it, each said fixing base further having two end faces (14a, 14b) symmetrically provided with respective second positioning snap-fixing means (15a, 16a, 15b, 16b) for one of said retaining strips (4) on each end face; each said retaining strips having an internal face and third positioning snap-fixing means (18a, 18b, 20a, 20b) on said internal face, said third positioning snap-fixing means being complementary to said second positioning snap-fixing means and snap-engagable therewith, said end plate (5A) being approximately rectangular in shape, and having:

an upper edge, a lower edge (22) provided with fourth positioning snap-fixing means (23a-23e) complementary to said first positioning snap-fixing means of said fixing bases and snap-fixable thereto;

two opposite edges (25) symmetrically provided with fifth positioning snap-fixing means (15c, 16c, 15d, 16d), identical to said second positioning snap-fixing means (15a, 16a, 15b,16b), for two further retaining strips (4), and snap-fixable to said further retaining strips, said fifth positioning snap-fixing means being situated at the same level relative to said upper edge of the end plate as the second positioning snap-fixing means of a fixing base are relative to the upper face of said fixing base.

17. An end plate according to claim 16, wherein the said upper edge (24) is provided with sixth positioning snap-fixing means (12k-12p), similar to said first positioning snap-fixing means (12a-12e) of said fixing bases.

18. An end plate according to claim 17, further comprising on said internal face (26) thereof, between the upper and lower edges of the said end plate, at least one longitudinal U-shaped card retaining groove (28) positioned slightly above the said lower edge and one transverse U-shaped card-retaining groove (27).

19. An end plate according to claim 17 having an external face (29), a plurality of snap-fixing holes (30) within said external face for receiving both way snap-fixing pegs (13), whereby face-to-face positioned end plates of adjacent modular functional blocks may be fastened together by said both way snap-fixing pegs fitted into aligned opposing snap-fixing holes, when said end plates are in abutment in order to reinforce the said adjacent modular functional blocks.

20. An end plate according to claim 19, wherein said internal face (26) includes at least one portion of increased thickness in which a transverse U-shaped card retaining groove 927) is formed.

21. An end plate according to claim 19, wherein one said transverse U-shaped cared retaining groove (27) is adjacent to each of the two side edges of said end plate to receive an edge of a closure card (7) positionable between a pair of said end plates (5) and a pair of retaining strips (4) in a modular functional block.

22. A locking strip (6A) for use in combination with at least one fixing base (3A, 3B) and one end plate (5A, 5B) of a modular functional block for mounting at least one circuit card (8), said fixing base being approximately rectangular in shape and having an elongated upper face (11) with first aligned positioning snap-fixing means (12a14 12e) thereon, said end plate being approximately rectangular in shape, having a lower edge (22) thereof including fourth positioning snap-fixing means (23a14 23e), which are complementary to said first-positioning snap-fixing means of said fixing bases and snap-fixable thereto, and an upper edge (24) provided with sixth positioning snap-fixing means (12k-12p), similar to said first positioning snap-fixing means of said fixing base, wherein said locking strip (6) comprises an elongated body of approximately rectangular form, provided with a U-shaped retaining longitudinal groove (31) for receiving a card (7, 8) and having seventh positioning snap-fixing means (23f-23j) identical to said fourth positioning snap-fixing means.

23. A locking strip (6A) according to claim 22, wherein said elongated body has two opposite ends, a tongue (32a) projecting outwardly from each end and wherein said elongated body has a length between tongues (32a, 32b) corresponding to the length of said fixing base between tongues (15a, 15b), and wherein all tongues have the same thickness.

* * * * *